United States Patent
Xu et al.

(10) Patent No.: US 11,941,337 B1
(45) Date of Patent: Mar. 26, 2024

(54) SYSTEM AND METHOD FOR MODELING NONLINEAR COMPONENT FOR USE IN CIRCUIT DESIGN

(71) Applicant: Keysight Technologies, Inc., Santa Rosa, CA (US)

(72) Inventors: Jianjun Xu, Petaluma, CA (US); David E. Root, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 328 days.

(21) Appl. No.: 17/390,882

(22) Filed: Jul. 31, 2021

Related U.S. Application Data (60) Provisional application No. 63/085,681, filed on Sep. 30, 2020.

(51) Int. Cl.
| | |
|---|---|
| *G06F 30/30* | (2020.01) |
| *G06F 30/27* | (2020.01) |
| *G06F 30/38* | (2020.01) |
| *G06F 30/39* | (2020.01) |
| *G06N 3/08* | (2023.01) |

(52) U.S. Cl.
CPC .............. *G06F 30/38* (2020.01); *G06F 30/27* (2020.01); *G06F 30/39* (2020.01); *G06N 3/08* (2013.01)

(58) Field of Classification Search
CPC ............ G06F 30/38; G06F 30/39; G06N 3/08
USPC .......................................................... 716/110
See application file for complete search history.

(56) References Cited

U.S. PATENT DOCUMENTS

| | | | |
|---|---|---|---|
| 9,009,638 B1 | 4/2015 | Hook et al. | |
| 11,636,242 B2* | 4/2023 | Khandelwal | G06F 30/398 716/106 |
| 2018/0203956 A1* | 7/2018 | Ng | G06F 30/398 |
| 2019/0228126 A1* | 7/2019 | Oh | G06F 30/327 |

(Continued)

OTHER PUBLICATIONS

Xiaolei Ding et al., "Neural-Network Approaches to Electromagnetic-Based Modeling of Passive Components and Their Applications to High-Frequency and High-Speed Nonlinear Circuit Optimization," IEEE Transactions On Microwave Theory and Techniques, vol. 52, No. 1, Jan. 2004, pp. 436-449.

(Continued)

*Primary Examiner* — Leigh M Garbowski (57) ABSTRACT

A method of modeling a nonlinear component includes providing a physical model for modeling a characteristic of the nonlinear component defined by a physical expression having a physical nonlinear function depending on variables and parameters of the nonlinear component; determining performance data for the characteristic; extracting global parameter values for the parameters based on the performance data; extracting local parameter values for the selected parameter, while keeping fixed the extracted global parameter values for the remaining parameters, based on the performance data corresponding to the characteristic using the physical expression; training an ANN function from the extracted local parameter values for the selected parameter depending on a variable; and determining a hybrid model for modeling the characteristic of the nonlinear component defined by a modified physical expression including the physical nonlinear function, the remaining parameters, and the trained ANN function depending on the variable in place of the selected parameter.

20 Claims, 6 Drawing Sheets

(56) References Cited

U.S. PATENT DOCUMENTS

| | | | |
|---|---|---|---|
| 2020/0272905 A1* | 8/2020 | Saripalli | G06N 3/082 |
| 2021/0064977 A1* | 3/2021 | Cecil | G06F 30/27 |
| 2021/0248514 A1* | 8/2021 | Cella | G06N 20/00 |
| 2021/0390237 A1* | 12/2021 | Khandelwal | G06F 18/24155 |
| 2022/0004854 A1* | 1/2022 | Lee | G06N 3/063 |
| 2022/0261654 A1* | 8/2022 | Wu | G06N 3/08 |

OTHER PUBLICATIONS

X. Ding et al., "A New Modeling Approach for Embedded Passives Exploiting State Space Formulation, "2002 32nd European Microwave Conference, pp. 1-4.

Kun Qian, "Variability Modeling and Statistical Parameter Extraction for CMOS Devices,"UC Berkeley Electronic Theses and Dissertations, 2015, https://escholarship.org/uc/item/19x656kn, pp. 1-157.

Samar K. Saha, "Compact Models for Integrated Circuit Design, "Crc Press, Taylor & Francis Group, 2016, pp. 1-548.

Kiyoshi Takeuchi et al., "Statistical Compact Model Parameter Extraction by Direct Fitting to Variations, " IEEE Transactions On Electron Devices, vol. 55, No. 6, Jun. 2008, pp. 1487-1493.

Iltcho Angelov et al. "An Empirical Table-Based FET Model, "IEEE Transactions On Microwave Theory and Techniques, vol. 47, No. 12, Dec. 1999, pp. 2350-3357.

\* cited by examiner

SYSTEM AND METHOD FOR MODELING NONLINEAR COMPONENT FOR USE IN CIRCUIT DESIGN

CROSS-REFERENCE TO RELATED APPLICATION

The present application claims priority under 35 U.S.C. § 119(e) to U.S. Provisional Application No. 63/085,681 filed on Sep. 30, 2020. The entire disclosure of U.S. Provisional Application No. 63/085,681 is specifically incorporated herein by reference in its entirety.

BACKGROUND

Nonlinear circuits may be designed using nonlinear models in order to determine the effects of different devices and parameters without having to build physical circuits. First-pass success in designing nonlinear circuits depends critically on the accuracy and robustness of the nonlinear models, such as "compact" transistor models, for example. These models are usually "physical" or "empirical" models. In both cases, they are defined by explicit expressions for such characteristics as current-voltage (I-V) and electric charge-voltage (Q-V) relations that define the detailed transistor performance. Conventional physical models rely on overly simplified physical expressions, and therefore do not fit very accurately actual measured characteristics of the devices they are designed to model. Conventional empirical models may be more accurate than the physical models with respect to performance data. However, because empirical models have much less underlying physical relationships than physical models, they usually can not be used for "what if" scenarios in predictive designs, where various parameters may be varied to provide different results.

"Data based" models, such as table-based models or global artificial neural network (ANN) models, for example, use copious measured data and interpolation or approximations as substitutes for physical expressions or compact empirical expressions. While for many circuit simulations, the data based models may be very accurate for design, they discard any of the underlying physics and are incapable of performing "what if" scenarios. The data based models also are typically valid under much more restrictive operating conditions than the physical and empirical models, specifically those operating conditions that are very close to the actual measurement conditions used for generating the data based models. The data based models also require a great deal more data than the physical and empirical models, and therefore require more measurements, longer data acquisition times, longer data processing times, and typically result in larger model file sizes.

Attempts have been made to combine physical and data based models, for example, by approximately modeling the component using the physical model, and then modeling the residual with a global ANN model to fit the difference between the physical model and the actual component's measured performance data, effectively simply adding the outcomes of the two types of models together. This technique, however, suffers from the disadvantages of both the physical and data based modeling methods in that it requires a great deal of data, restricts the valid operating range of the model, and reduces the predictability in "what-if" scenarios.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Nonlinear circuits are designed at the component level in order to provide desired functionality. Generally, a circuit designer begins by establishing performance criteria of the nonlinear circuit to be created. The performance criteria may be provided by specification, for example. Once the performance criteria are established, a circuit designer models the arrangement and capabilities of the individual components, including nonlinear components, to provide this performance criteria. The nonlinear circuits are made up of one or more nonlinear components. For example, the nonlinear circuits may include power amplifiers, frequency translation devices (e.g., mixers, frequency converters), and inverters, while the nonlinear components may include diodes, nonlinear resistors and capacitors, and transistors, such as field-effect transistors (FETs) and bipolar junction transistors, for example.

Figure 1:
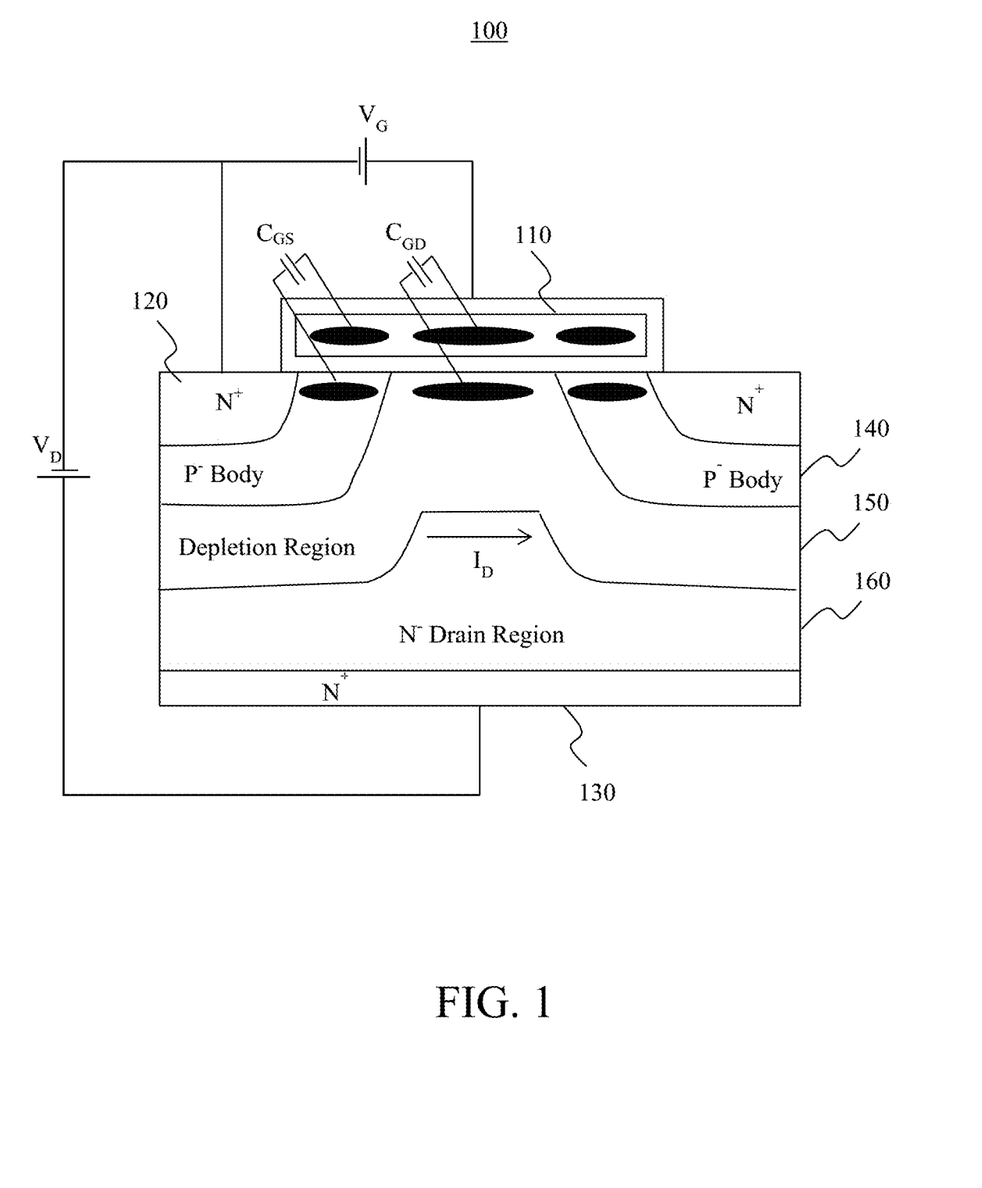
FIG. 1 is a simplified cross-sectional diagram of a field-effect transistor (FET) to be designed according to representative embodiments, for purposes of illustration.

FIG. 1 is a simplified cross-sectional diagram of a FET, which is to be designed according to the representative embodiments described herein. Referring to FIG. 1, a transistor 100 (e.g., FET) includes a gate 110, a source 120, and a drain 130. In the depicted example, the gate 110 may be formed of an electrically conductive material, such as metal-oxide, surrounded by an electrically insulating layer, such as silicon dioxide, for example. Both the source 120 and the drain 130 are N+ doped regions of a substrate, which may be formed of silicon, for example. However, any other compatible materials may be incorporated for forming the transistor 100. The transistor 100 further includes a body 140 formed of P− doped silicon, a depletion region 150, and a drain region 160 formed of N− doped silicon, where the body 140 is between the gate 110/source 120 and the depletion region 150, the depletion region 150 is between the gate 110/body 140 and the drain region 160, and the drain region 160 is between the depletion region 150 and the drain 130.

Also shown in FIG. 1 are a number of characteristics of the transistor 100. For example, drain current $I_D$ is shown flowing through the drain region 160, gate voltage $V_G$ is shown across the gate 110 and the source 120, and the drain voltage $V_D$ is shown across the source 120 and the drain 130. Additional characteristics may include capacitance $C_{GS}$ between the gate 110 and the body 140 and capacitance $C_{GD}$ between the gate 110 and the depletion region 150, for example. The characteristics of the transistor 100 are to be modeled using a combination of physical and data based models, according to the embodiment discussed herein.

Generally, starting from an existing physical model (compact nonlinear circuit simulation model) or empirical model and a sparse set of performance data, the various embodiments improve accuracy of a provided model, while retaining most of the physics and predictability of the compact nonlinear circuit simulation model. The embodiments combine the benefits of the data based model approaches and the physical model or empirical model formulations.

Figure 2:
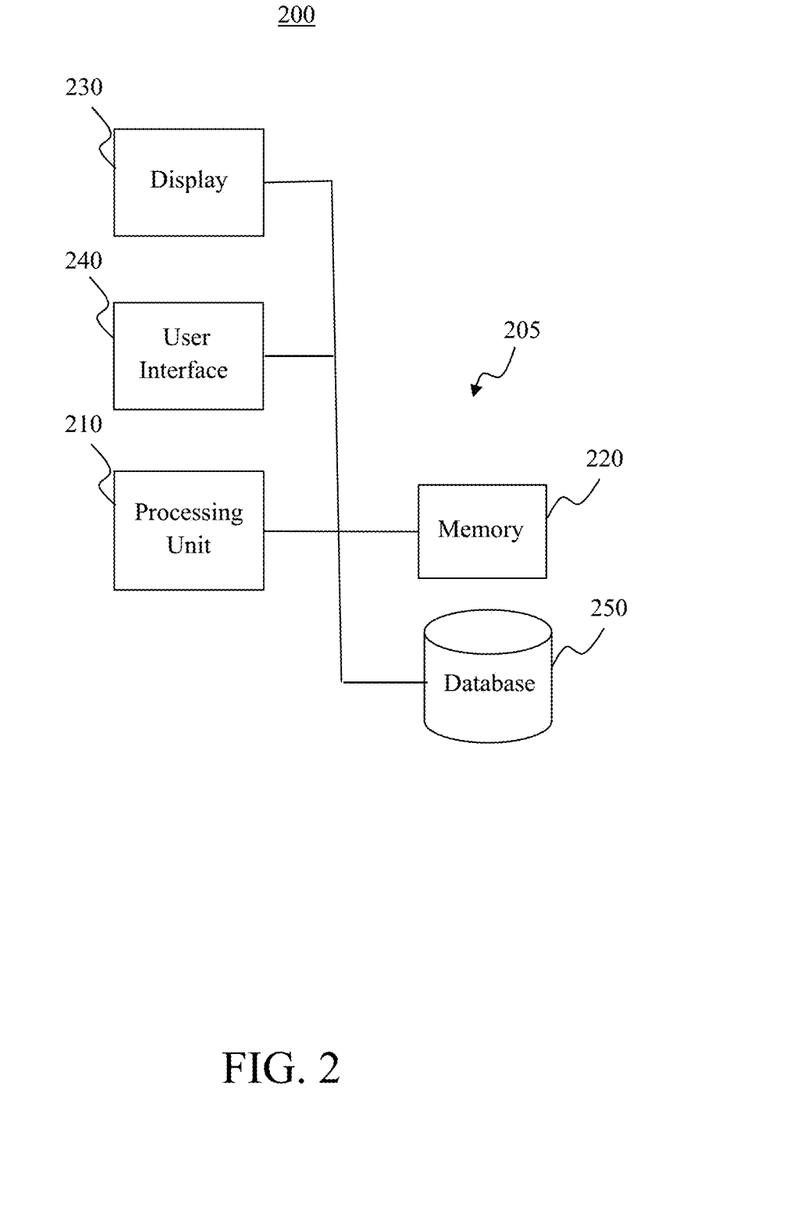
FIG. 2 is a simplified block diagram showing a system for modeling a nonlinear component for use in designing a circuit incorporating the modeled nonlinear component, according to a representative embodiment.

FIG. 2 is a simplified block diagram showing a system for modeling nonlinear components for use in designing a circuit incorporating the modeled nonlinear component, according to a representative embodiment.

Referring to FIG. 2, a circuit design system 200 includes a computer workstation 205 from which the design process is supervised and/or managed. The computer workstation 205 includes a processing unit 210, memory 220 for storing instructions executable by the processing unit 210 to implement the processes described herein, as well as a display 230 and an interface 240 to enable user interaction. The computer workstation 205 may further include a database 250 that stores information to be used for designing the nonlinear components according to the embodiments herein, including compact nonlinear circuit simulation models corresponding to different types of nonlinear components, such as the illustrative transistor 100, for example. The circuit design system 200 may be embodied in a circuit simulator, as would be apparent to one skilled in the art.

The processing unit 210 is representative of one or more processing devices, and is configured to execute software instructions to perform functions as described in the various embodiments herein. The processing unit 210 may be implemented by a general purpose computer, a central processing unit, one or more processors, microprocessors or microcontrollers, a state machine, a programmable logic device, field programmable gate arrays (FPGAs), application specific integrated circuits (ASICs), or combinations thereof, using any combination of hardware, software, firmware, hard-wired logic circuits, or combinations thereof. The term "processor," in particular, encompasses an electronic component able to execute a program or machine executable instructions. References to "a processor" should be interpreted to include more than one processor or processing core, as in a multi-core processor, and/or parallel processors. A processor may also refer to a collection of processors within a single computer system or distributed among multiple computer systems, such as in a cloud-based or other multi-site application. Programs have software instructions performed by one or multiple processors that may be within the same computing device or which may be distributed across multiple computing devices.

The memory 220 may include a main memory and/or a static memory, where such memories may communicate with each other and the processing unit 210 via one or more buses. The memory 220 stores instructions used to implement some or all aspects of methods and processes described herein. The memory 220 may be implemented by any number, type and combination of random access memory (RAM) and read-only memory (ROM), for example, and may store various types of information, such as software algorithms, data based models including ANN and other neural network based models, and computer programs, all of which are executable by the processing unit 210. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art. The memory 220 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 220 may store software instructions and/or computer readable code that enable performance of various functions. The memory 220 may be secure and/or encrypted, or unsecure and/or unencrypted.

Similarly, the database 250 stores data and instructions used to implement some or all aspects of methods and processes described herein. The database 250 may be implemented by any number, type and combination of RAM and ROM, for example, and may store various types of information, such as software algorithms, data based models including ANN and other neural network based models, and computer programs, all of which are executable by the processing unit 210. The various types of ROM and RAM may include any number, type and combination of computer readable storage media, such as a disk drive, flash memory, EPROM, EEPROM, registers, a hard disk, a removable disk, tape, CD-ROM, DVD, floppy disk, blu-ray disk, USB drive, or any other form of storage medium known in the art. The database 250 is a tangible storage medium for storing data and executable software instructions and are non-transitory during the time software instructions are stored therein. The database 250 may be secure and/or encrypted, or unsecure and/or unencrypted.

"Memory" and "database" are examples of computer-readable storage media, and should be interpreted as possibly being multiple memories or databases. The memory or database may for instance be multiple memories or databases local to the computer, and/or distributed amongst multiple computer systems or computing devices.

The display 230 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 230 may also provide a graphical user interface (GUI) for displaying and receiving information to and from the user. The interface 240 may include a user and/or network interface for providing information and data output by the processing unit 210 and/or the memory 220 to the user and/or for receiving information and data input by the user. That is, the interface 240 enables the user to enter data and to control or manipulate aspects of the processes described herein, and also enables the processing unit 210 to indicate the effects of the user's control or manipulation. The interface 240 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example, or any other peripheral or control to permit user feedback from and interaction with the computer workstation 205. The interface 240 may further include one or more of ports, disk drives, wireless antennas, or other types of receiver circuitry.

Figure 3:
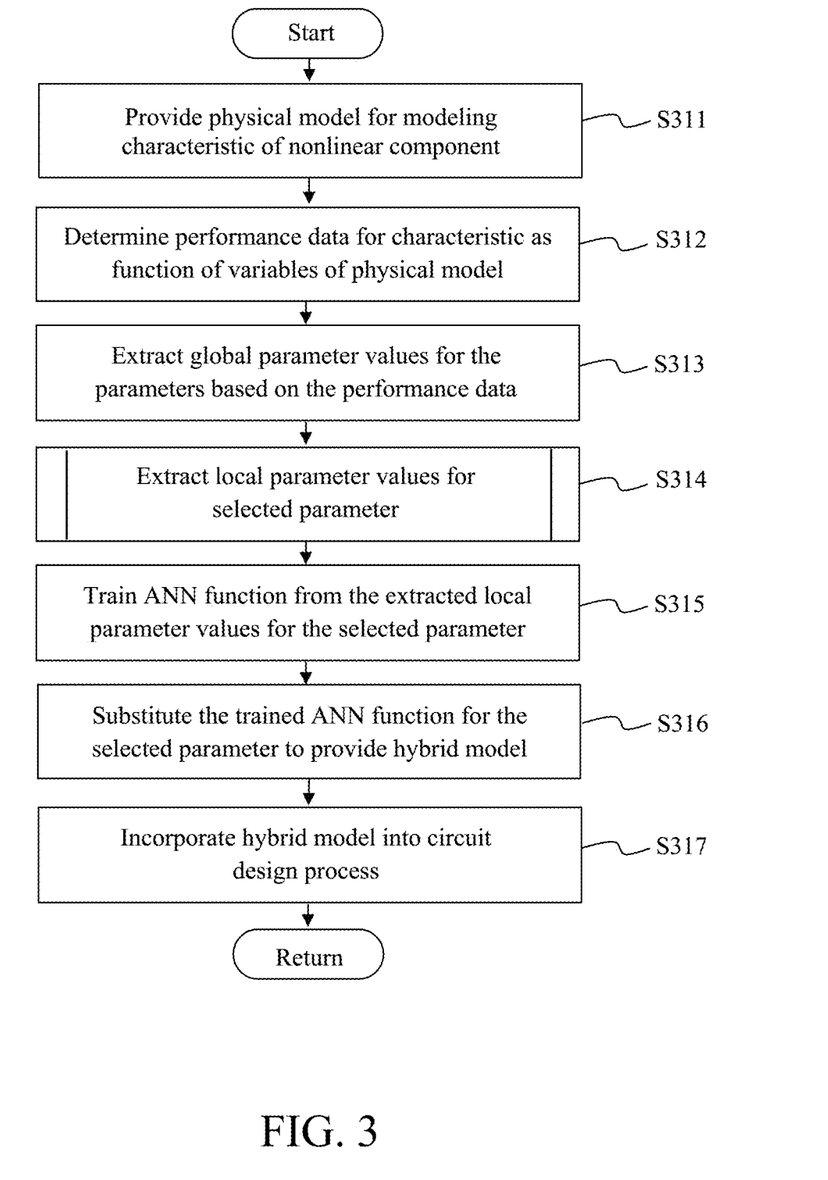
FIG. 3 is a simplified flow diagram illustrating a method of modeling a nonlinear component for use in designing a circuit incorporating the modeled nonlinear component, according to a representative embodiment.

FIG. 3 is a simplified flow diagram illustrating a method of modeling nonlinear components for use in designing a circuit incorporating the modeled nonlinear component, according to a representative embodiment. The method may be implemented by the computer workstation 205, for example, where the method steps are provided as instructions stored in the memory 220 and executable by the processing unit 210.

For purposes of illustration and not limitation, the nonlinear component being modeled is a transistor, such as the illustrative transistor 100 shown in FIG. 1, for example, which may be incorporated into a nonlinear circuit being designed. Therefore, although the steps apply to nonlinear components generally, aspects of FIG. 3 are described below referencing the transistor 100 for clarity. Also, for purposes of illustration and not limitation, it is assumed that the characteristic of the transistor 100 being modeled is drain current $I_D$. It is understood, however, that the method depicted in FIG. 3 is applicable to any of various types of nonlinear components, including diodes, nonlinear resistors and capacitors, and different types of transistors, and is further applicable to characteristics of a transistor other than drain current, without departing from the scope of the present teachings.

Referring to FIG. 3, the method includes providing a physical model for modeling a characteristic of the nonlinear component in block S311. The physical model may be retrieved from the database 250, for example. For a transistor, the characteristic being modeled may be drain current $I_D$, gate-source capacitance $C_{GS}$, and gate-drain capacitance $C_{GD}$, for example. As mentioned above, a example of the disclosed method assumes that the nonlinear component is a transistor (e.g., transistor 100), and that the characteristic being modeled is drain current $I_D$, for purposes of explanation and not limitation. In alternative embodiment, an empirical model may be provided in place of the physical model.

The physical model is defined by a physical expression for the characteristic to be modeled. The physical expression may be determined by well known approximate solutions of partial differential equations governing carrier transport and charge storage in semiconductor devices, such as codified in well known textbooks and publications in the technical literature, or ratified by standard bodies such as the Compact Model Council, as would be apparent to one skilled in the art. The physical expression includes a physical nonlinear function that depends on one or more variables and one or more parameters of the nonlinear component. For a physical model, parameters are typically numerical values associated with properties of the particular component, such as threshold voltage Vth for a transistor and mobility μ for a charge carrier in the transistor, for example. Variables are the arguments of the mathematic expression that defines the characteristic. In the depicted example, variables are applied terminal voltages, such as gate voltage $V_G$ and drain voltage $V_D$, for example. So, generally, the characteristic to be modeled is equal to the physical nonlinear function of the variables and the parameters or the empirical nonlinear function of the variables and the parameters.

In the present example, since the characteristic to be modeled is the drain current $I_D$, the physical expression for determining the drain current $I_D$ may be indicated by Expression (1), where $I_D^{phys}$ is the physical nonlinear function, $V_G$ and $V_D$ are representative variables, and $P_1 \ldots P_N$ are representative parameters:

$$I_D = I_D^{phys}(V_G, V_D; P_1, \ldots P_N) \quad (1)$$

In particular, the variable $V_G$ is gate voltage of the transistor, the variable $V_D$ is drain voltage of the transistor. The parameters $P_1 \ldots P_N$ may be any of a variety of parameters, such as threshold voltage Vth and mobility µ, for example. One of the parameters is deemed to be a selected parameter, for which local parameter values will be extracted, as discussed below, while the remaining (unselected) parameters are fixed in value. That is, the selected parameter is effectively replaced with an ANN function of a data based model, to be trained as indicated in block S315, below. In the present example, parameter $P_1$ will be the selected parameter, and parameters $P_2 \ldots P_N$ will be the remaining parameters, although it is understood that any of the parameters $P_1 \ldots P_N$ may be the selected parameter and/or more than one of the parameters $P_1 \ldots P_N$ may be identified as selected parameters, without departing from the scope of the present teachings.

In block S312 of FIG. 3, performance data for the characteristic are determined as a function depending on the variables of the physical model. The performance data are measurable characteristics, such as the drain current $I_D$, sampled at particular values of applied bias voltages, such as the gate voltage $V_G$ and the drain voltage $V_D$, and may be determined by electrical measurements using a curve tracer, for example. That is, in the present example, performance data for the characteristic $I_D$ are determined as a function of the variables gate voltage $V_G$ and drain voltage $V_D$. The parameters depend on the physical model and the particular physical expression, such as Expression (1). The parameters are determined by "fitting" Expression (1) to the performance data, so when Expression (1) is evaluated at numerical values of the variables corresponding to the actual applied stimulus portion of the performance data, the modeled characteristic agrees with the measured performance data as closely as possible. The performance data may be stored or cached, for example, in the memory 220 or a cache memory (not shown).

In block S313, global parameter values for the parameters are extracted based on the performance data corresponding to the characteristic using the physical expression. Extracting the global parameter values may include performing optimization, for example, as would be apparent to one skilled in the art. The optimization varies the parameter values until the difference between the output of the physical model and the measured characteristic of the performance dataset is minimized. In an embodiment, the global parameter values are extracted for all of the parameters, including the selected parameter, over the full range of all variables. In the present example, global parameter values are extracted for the parameters $P_1 \ldots P_N$. The global parameter values may be stored or cached, for example, in the memory 220 or a cache memory (not shown).

Block S314 depicts a process for extracting local parameter values for the selected parameter (e.g., parameter $P_1$) of the multiple parameters, while the extracted global parameter values for the remaining parameters are kept fixed. The local parameter values are extracted based on the performance data for the characteristic that were determined in block S312 using the physical expression. The extracted local parameter values provide a distribution of the extracted local parameter values for the selected parameter corresponding to different values of at least one variable of the multiple variables (e.g., gate voltage $V_G$ and drain voltage $V_D$). The process for extracting the local parameter values is described in more detail with reference to FIG. 4, below.

An ANN function (or other AI function) of a data based model is trained in block S315 from the extracted local parameter values for the selected parameter depending on the at least one variable. The ANN function starts from a simple default network structure, such as two hidden layers with three neurons in each layer, for example, and then training the default network using known methods, such as backpropagation, for example. The ANN function or the data based model including the ANN function may be retrieved from the database 250, for example. Training the ANN function includes identifying numerical values of weights and biases of the default network such that the ANN function best approximates a distribution of local parameter values of the selected parameter as a function of the at least one variable. The trained ANN function is substituted for the selected parameter of the physical expression. In the present example, the ANN function being trained is used in place of the selected parameter $P_1$, and thus may be referred to as the ANN function $P_1^{ANN}$. It is understood that an appropriate ANN function may be used in place of any selected parameter(s) for which local parameter values have been extracted, where each selected parameter will have its own corresponding ANN function.

In block S316, trained ANN function is substituted for the selected parameter to provide a hybrid model for modeling the characteristic of the nonlinear component, where the hybrid model is an artificial intelligence (AI) model defined by a modified physical expression of the physical model for the characteristic. That is, the modified physical expression essentially is the original physical expression of physical model (e.g., Expression (1)) with the trained ANN function(s) (e.g., ANN function $P_1^{ANN}$) replacing the selected parameter(s). That is, the modified physical expression includes (i) the same physical nonlinear function (e.g., physical nonlinear function $I_D^{phys}$) that depends on the at least one variable, (ii) the same remaining parameters (e.g., remaining parameters $P_2 \ldots P_N$) as in the original physical expression, and (iii) the trained ANN function (e.g., ANN function $P_1^{ANN}$) from block S315 in place of the selected parameter(s). As discussed above, the trained ANN function depends on the at least one variable.

In an embodiment, determining the hybrid model may include generating modified computer code using the processing unit 210, where the modified computer code includes code for the trained ANN function in place of the selected parameter for implementing the hybrid model. That is, a parameter value in a line of code may be substituted with a formula corresponding to the trained ANN function. In the present example, the modified computer code includes code to generate the complicated formula from the trained ANN function $P_1^{ANN}$, and to insert this code representation of the trained ANN function $P_1^{ANN}$ into the physical expression in the place formerly occupied by the value of the selected parameter $P_1$.

In block S317, the hybrid model is incorporated into a circuit design process, performed by the circuit designer using, for example, the computer workstation 205. All or portions of the circuit design process may be implemented automatically, for example, by the processing unit 210. The circuit design process involves any and all aspects of determining and verifying a nonlinear circuit design, discussed above. This includes modeling nonlinear components and/or nonlinear circuits consisting of the nonlinear components. For example, the circuit design process may include modeling a nonlinear component to actually design a nonlinear circuit, where the hybrid model is used to determine the values of one or more characteristics being modeled. Also, the nonlinear circuit may be designed by predicting how the nonlinear component would behave in the nonlinear circuit using the hybrid model. Alternatively, or in addition, the circuit design process may include predicting performance characteristics of a modified nonlinear component using simulated characteristics of the hybrid model obtained by modifying the remaining parameter values. That is, once the hybrid model has been established, the circuit designer may easily compute different values of the characteristic simply by changing/modifying one or more of the remaining parameter values in order to instantly observe the effects of these changes/modifications.

In comparison, conventional techniques based on data based models cannot easily predict the characteristic being modeled for different parameter values because they are not defined in terms of conventional parameters at all. In fact, conventional data based models are referred to as "nonparametric" models. Also in comparison, conventional techniques based on physical models cannot as accurately predict the characteristic being modeled for different parameter values because they are not as accurate as the conventional data based models that have been trained on the unmodified component performance data to begin with.

Figure 4:
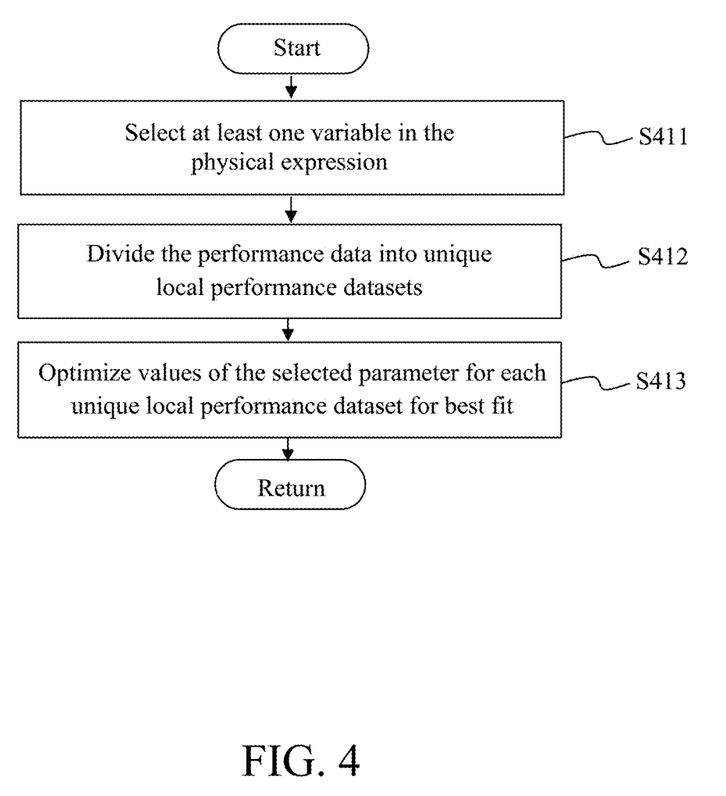
FIG. 4 is a simplified flow diagram of a method for extracting local parameter values for a selected parameter, according to representative embodiment.

FIG. 4 is a simplified flow diagram of a method for extracting local parameter values for a selected parameter, according to representative embodiment. As mentioned above, FIG. 4 depicts the process indicated by block S314 in FIG. 3.

Referring to FIG. 4, at least one variable in the physical expression of the physical model is selected in block S411. When there is a single variable in the physical expression, that variable is selected. Otherwise, one or more variables are selected from among multiple variables. In the present example, the at least one variable selected may be the gate voltage $V_G$ selected from among the variables gate voltage $V_G$ and drain voltage $V_D$. Of course, the drain voltage $V_D$ may be selected, or when a different characteristic of the FET is sought or when a different nonlinear component is the subject of the circuit design process, a different variable may be selected, without departing from the scope of the present teachings.

In block S412, the performance data that has been determined for the characteristic as a function of the variables in the physical expression in block S312 are divided into unique local performance datasets. Each unique local performance dataset corresponds to local sampled values of the characteristic within a subrange of the at least one selected variable, while values of any other variables range over a previous set of discrete values.

In block S413, for each unique local performance dataset, values of the selected parameter are optimized to fit best over that unique local performance dataset, while the global parameter values of the remaining parameters from the global parameter value extraction are kept fixed. The optimization may be performed over a local range of the variables using a best fit algorithm, such as a Quasi-Newton standard, for example, as would be apparent to one skilled in the art. The optimization varies the selected parameter value until the difference between the output of the physical model and the measured characteristic of the local performance dataset is minimized. This creates distinct numerical values of the selected parameter optimized for each local performance dataset. There is one optimized value for each unique local performance dataset for the local sampled values of the selected at least one variable. The distribution of the extracted local parameter values for the selected parameter provided in block S314 is a function of the optimized values of the selected parameter. The extracted local parameter values for the selected parameter (e.g., parameter $P_1$) are used in block S315 for training the ANN function from the extracted local parameter values for the selected parameter, as discussed above.

As stated above, the drain current $I_D$ is merely an example of a FET characteristic that may be modeled using the hybrid model, according to representative embodiments, and is not limiting as to the applicability of the hybrid model. Another example of a FET characteristic that may be modeled is total gate charge $Q_G$, which determines nonlinear capacitances. The physical expression for determining the total gate charge Q G may be indicated by Expression (2), where $Q_G^{phys}$ is the physical nonlinear function, $V_G$ and V D are representative variables, and $p_1 \ldots p_N$ are representative parameters:

$$Q_G = Q_G^{phys}(V_G, V_D; p_1, \ldots p_m) \qquad (2)$$

The variable $V_G$ is gate voltage of the transistor, the variable $V_D$ is drain voltage of the transistor. The parameters $p_1 \ldots p_m$ may be any of a variety of parameters, such as threshold voltage (Vth) or Gate-Source ON capacitance, for example. As in the previous example, one of the parameters is deemed to be a selected parameter, for which local parameter values will be extracted, while the remaining (unselected) parameters are fixed in value. Otherwise, the method of designing the nonlinear component (FET) is performed the same as discussed above with reference to FIGS. 3 and 4.

The hybrid model according to representative embodiments improves modeling accuracy of circuit designs, as compared to measured data from the nonlinear circuits resulting from the circuit deigns, as compared to conventional physical models. This is shown, for example, by the comparative performance graphs in FIGS. 5A and 5B and FIGS. 6A and 6B.

Figure 5A:
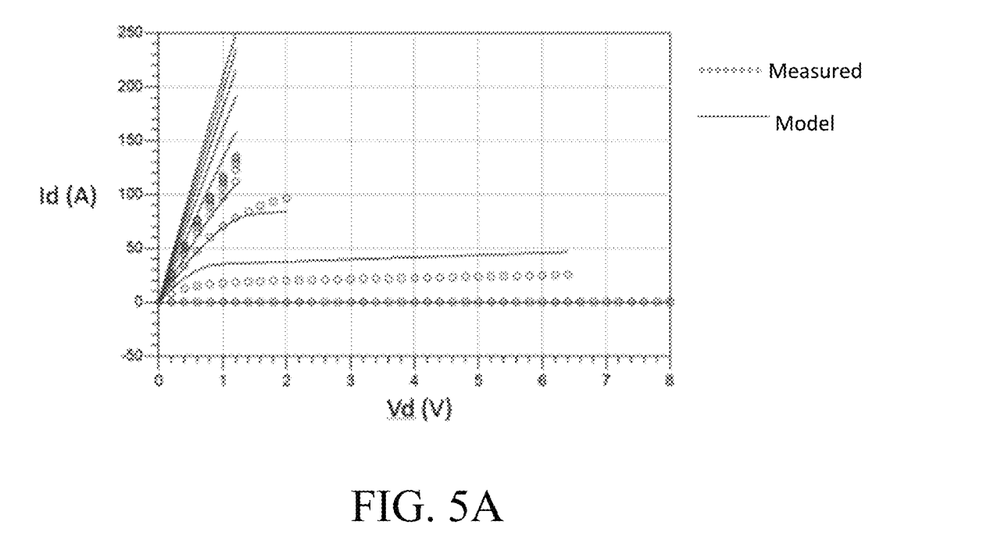
FIG. 5A is a graph showing plots of modelled and measured drain current vs. drain voltage performance of a nonlinear transistor using a conventional physical model.
Figure 5B:
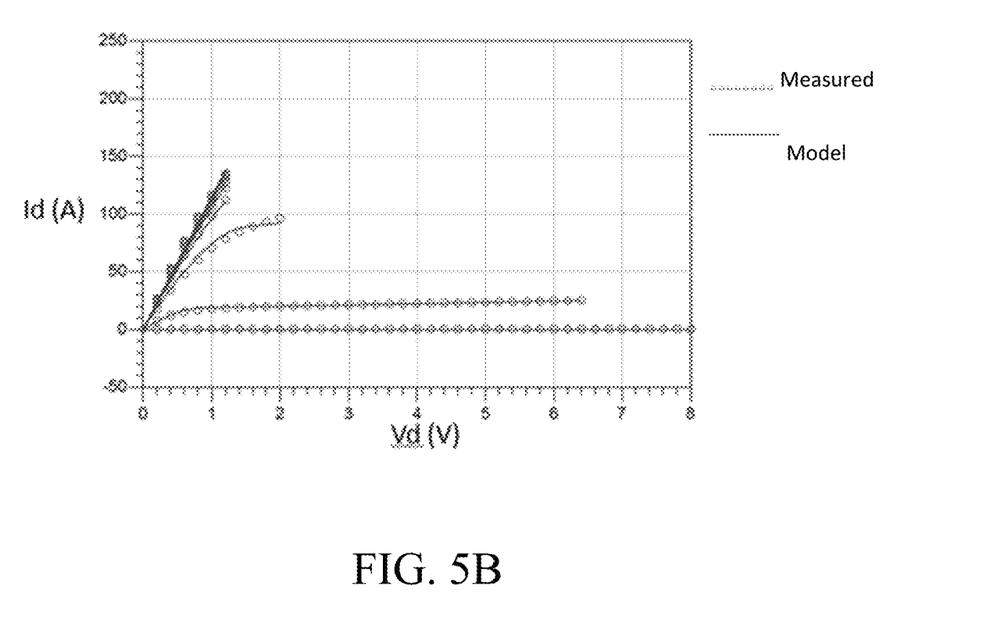
FIG. 5B is a graph showing plots of modelled and measured drain current vs. drain voltage performance of a nonlinear transistor using a hybrid model, according to a representative embodiment.

FIG. 5A is a graph showing plots of modelled and measured drain current vs. drain voltage performance of a nonlinear transistor using a conventional physical model, and FIG. 5B is a graph showing plots of modelled and measured drain current vs. drain voltage performance of a nonlinear transistor using a hybrid model, according to a representative embodiment.

Referring to FIGS. 5A and 5B, the characteristic being modeled by each of the physical model and the hybrid model is drain current (vertical axis), and drain voltage (horizontal axis) is one of the variables in the physical model and the hybrid model. The solid lines are modeled values produced by the respective models, and the dashed lines are measured values of the nonlinear components designed using the respective models. As shown in FIG. 5B, the modeled values produced by the hybrid model more closely align with the corresponding measured values than the modeled values produced by the physical model align with the corresponding measured values in FIG. 5A.

Figure 6A:
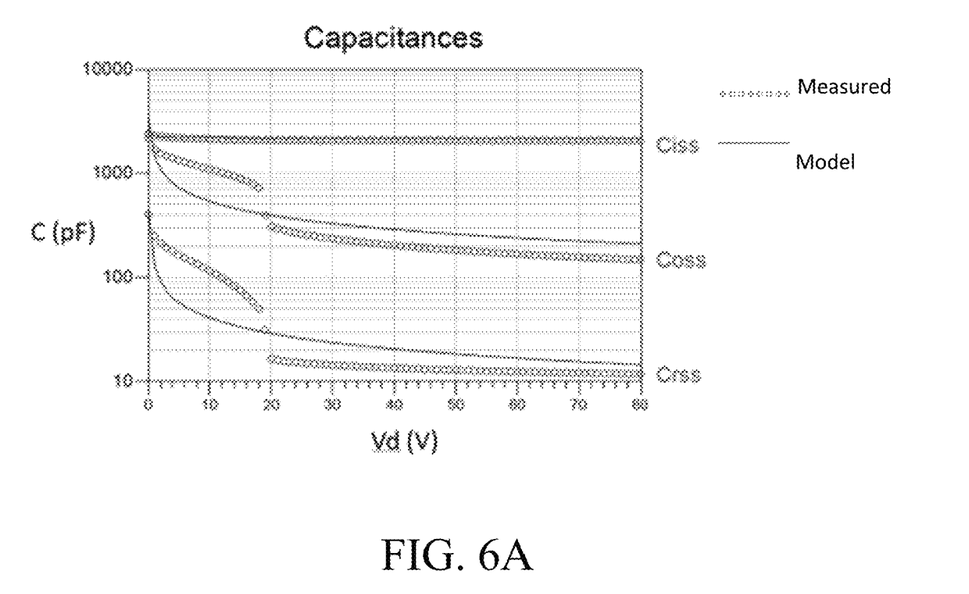
FIG. 6A is a graph showing plots of modelled and measured capacitances vs. drain voltage performance of a nonlinear transistor using a conventional physical model.
Figure 6B:
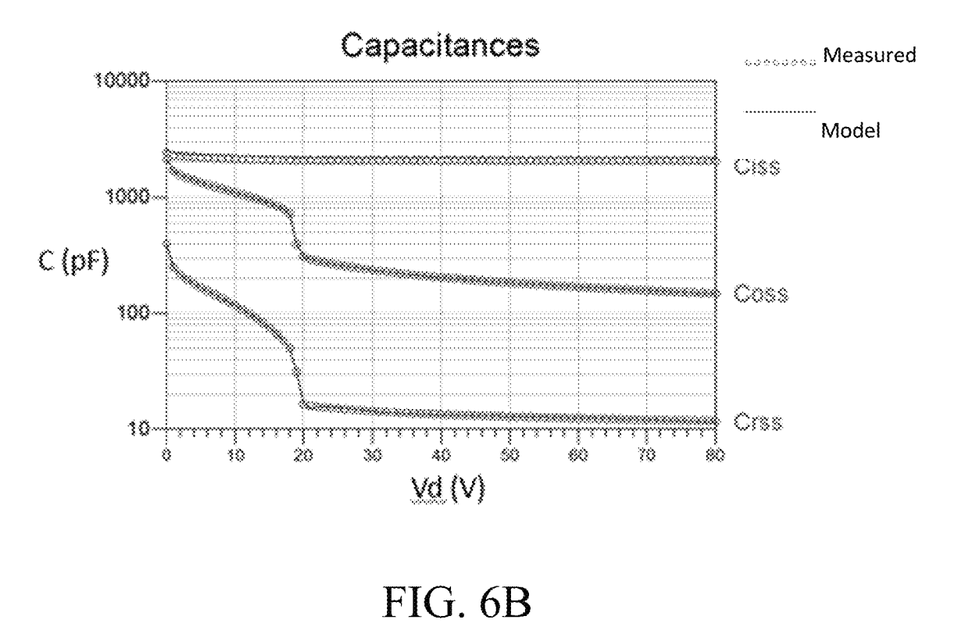
FIG. 6B is a graph showing plots of modelled and measured capacitances vs. drain voltage performance of a nonlinear transistor using a hybrid model, according to a representative embodiment.

FIG. 6A is a graph showing plots of modelled and measured capacitances vs. drain voltage performance of a nonlinear transistor using a conventional physical model. FIG. 6B is a graph showing plots of modelled and measured capacitances vs. drain voltage performance of a nonlinear transistor using a hybrid model, according to a representative embodiment.

Referring to FIGS. 6A and 6B, the characteristic being modeled by each of the physical model and the hybrid model are the charge-based nonlinear capacitances of the transistor (vertical axis), and drain voltage (horizontal axis) is one of the variables in the physical model and the hybrid model. In the example, the modeled capacitances include input capacitance (Ciss), output capacitance (Coss) and reverse transfer capacitance (Crss). Again, the solid lines are modeled values produced by the respective models, and the dashed lines are measured values of the characteristics of the nonlinear component. As shown in FIG. 6B, the modeled values produced by the hybrid model more closely align with the corresponding measured values than the modeled values produced by the physical model align with the corresponding measured values in FIG. 6A.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of modeling a nonlinear component for use in circuit design, the method comprising:
providing a physical model for modeling a characteristic of the nonlinear component defined by a physical expression for the characteristic, wherein the physical expression comprises a physical nonlinear function depending on at least one variable and a plurality of parameters of the nonlinear component, wherein the plurality of parameters include a selected parameter and remaining parameters;
determining performance data for the characteristic as a function depending on the at least one variable of the physical model;
extracting global parameter values for the plurality of parameters based on the performance data corresponding to the characteristic using the physical expression;
extracting local parameter values for the selected parameter of the plurality of parameters, while keeping fixed the extracted global parameter values for the remaining parameters of the plurality of parameters, based on the performance data corresponding to the characteristic using the physical expression;
training an artificial neural network (ANN) function from the extracted local parameter values for the selected parameter depending on the at least one variable;
determining a hybrid model for modeling the characteristic of the nonlinear component defined by a modified physical expression for the characteristic, wherein the modified physical expression comprises the same physical nonlinear function depending on the at least one variable, the remaining parameters, and the trained ANN function depending on the at least one variable in place of the selected parameter; and
designing a nonlinear circuit by predicting how the nonlinear component would behave in the nonlinear circuit using the hybrid model or predicting performance characteristics of a modified nonlinear component using simulated characteristics of the hybrid model obtained by modifying the remaining parameter values.

2. The method of claim 1, wherein the extracted local parameters provide a distribution of the extracted local parameter values for the selected parameter corresponding to different values of the at least one variable.

3. The method of claim 2, wherein extracting the local parameter values for the selected parameter comprises:
selecting the at least one variable;
dividing the determined performance data for the characteristic into unique local performance datasets, wherein each unique local performance dataset corresponds to local sampled values of the characteristic within a unique subrange of the selected at least one variable;
for each unique local performance dataset, optimizing values of the selected parameter; and
providing the distribution of the extracted local parameter values for the selected parameter as a function of the optimized values of the selected parameter.

4. The method of claim 3, wherein optimizing the values of the selected parameter comprises performing a best fit over the unique local performance dataset, while keeping the global parameter values of the remaining parameters fixed from the global parameter value extraction, and creating distinct numerical values of the optimized values of the selected parameter.

5. The method of claim 4, wherein there is one optimized value for each unique local performance dataset for the local sampled values of the selected at least one variable.

6. The method of claim 3, wherein values of any other variables of the at least one variable range over a previous set of discrete values.

7. A system for modeling a nonlinear component for use in circuit design, the system comprising:
at least one processor; and at least one memory that or stores instructions that, when executed by the at least one processor, causes the at least one processor to:

provide a physical model for modeling a characteristic of the nonlinear component defined by a physical expression for the characteristic, wherein the physical expression comprises a physical nonlinear function depending on at least one variable and a plurality of parameters of the nonlinear component, wherein the plurality of parameters include a selected parameter and remaining parameters;

determine performance data for the characteristic as a function depending on the at least one variable of the physical model;

extract global parameter values for the plurality of parameters based on the performance data corresponding to the characteristic using the physical expression;

extract local parameter values for the selected parameter of the plurality of parameters, while keeping fixed the extracted global parameter values for the remaining parameters of the plurality of parameters, based on the performance data corresponding to the characteristic using the physical expression, wherein the extracted local parameters provide a distribution of the extracted local parameter values for the selected parameter corresponding to different values of the at least one variable;

train an artificial neural network (ANN) function from the extracted local parameter values for the selected parameter depending on the at least one variable;

determine a hybrid model for modeling the characteristic of the nonlinear component defined by a modified physical expression for the characteristic, wherein the modified physical expression comprises the same physical nonlinear function depending on the at least one variable, the remaining parameters, and the trained ANN function depending on the at least one variable in place of the selected parameter; and design a nonlinear circuit by predicting how the nonlinear component would behave in the nonlinear circuit using the hybrid model or predicting performance characteristics of a modified nonlinear component using simulated characteristics of the hybrid model obtained by modifying the remaining parameter values.

8. The system of claim 7, wherein the instructions cause the processor to extract the local parameter values for the selected parameter by:

selecting the at least one variable;

dividing the determined performance data for the characteristic into unique local performance datasets, wherein each unique local performance dataset corresponds to local sampled values of the characteristic within a unique subrange of the selected at least one variable;

optimizing values of the selected parameter for each unique local performance dataset; and providing the distribution of the extracted local parameter values for the selected parameter as a function of the optimized values of the selected parameter.

9. The system of claim 8, wherein optimizing the values of the selected parameter comprises performing a best fit over the unique local performance dataset, while keeping the global parameter values of the remaining parameters fixed from the global parameter value extraction, and creating distinct numerical values of the optimized values of the selected parameter.

10. The system of claim 9, wherein there is one optimized value for each unique local performance dataset for the local sampled values of the selected at least one variable.

11. The system of claim 8, wherein values of any other variables of the at least one variable range over a previous set of discrete values.

12. The system of claim 7, wherein the characteristic comprises one of a drain current or a total gate charge of a transistor.

13. A non-transitory computer readable medium having stored thereon software instructions that, when executed by one or more processors, cause the processor to model a nonlinear component for use in circuit design by:

providing a physical model for modeling a characteristic of the nonlinear component defined by a physical expression for the characteristic, wherein the physical expression comprises a physical nonlinear function depending on at least one variable and a plurality of parameters of the nonlinear component;

selecting a parameter of the plurality of parameters to replaced with an artificial neural network (ANN) function of a variable of the at least one variable to provide a hybrid model for modeling the characteristic of the nonlinear component; and using the hybrid model to predict how the nonlinear component would behave in a nonlinear circuit in order to design a nonlinear circuit.

14. The computer readable medium of claim 13, the instructions further causing the processor to:

use simulated characteristics of the hybrid model to predict a performance characteristic of a modified nonlinear component.

15. The computer readable medium of claim 13, the instructions further causing the processor to:

determine performance data for the characteristic as a function depending on the at least one variable of the physical model;

extract global parameter values for the at least one parameter based on the performance data using the physical expression;

extract local parameter values for the selected parameter, while keeping fixed the extracted global parameter values for any remaining parameters of the plurality of parameters, based on the performance data corresponding to the characteristic using the physical expression; and train the ANN function from the extracted local parameter values for the selected parameter, wherein the hybrid model is defined by a modified physical expression for the characteristic, and wherein the modified physical expression comprises the same physical nonlinear function depending on the at least one variable, any remaining parameters, and the trained ANN function depending on the at least one variable in place of the selected parameter.

16. The computer readable medium of claim 15, wherein the extracted local parameters provide a distribution of the extracted local parameter values for the selected parameter corresponding to different values of the at least one variable.

17. The computer readable medium of claim 16, wherein the instructions further cause the processor to extract the local parameter values for the selected parameter by:

selecting the at least one variable;

dividing the determined performance data for the characteristic into unique local performance datasets, wherein each unique local performance dataset corresponds to local sampled values of the characteristic within a unique subrange of the selected at least one variable;

optimizing values of the selected parameter for each unique local performance dataset; and providing the distribution of the extracted local parameter values for the selected parameter as a function of the optimized values of the selected parameter.

18. The computer readable medium of claim 17, wherein optimizing the values of the selected parameter comprises performing a best fit over the unique local performance dataset, while keeping the global parameter values of the remaining parameters fixed from the global parameter value extraction, and creating distinct numerical values of the optimized values of the selected parameter.

19. The computer readable medium of claim 18, wherein there is one optimized value for each unique local performance dataset for the local sampled values of the selected at least one variable.

20. The computer readable medium of claim 17, wherein values of any other variables of the at least one variable range over a previous set of discrete values.

* * * * *